Figure 1:
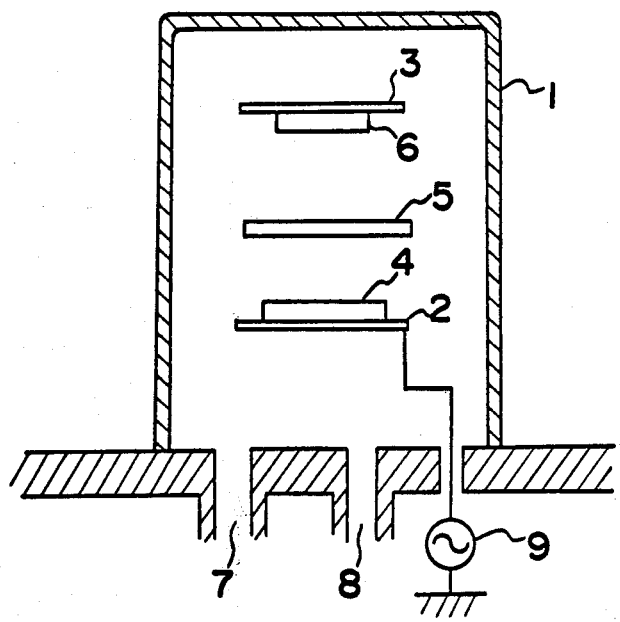

United States Patent [19]

Ogawa et al.

[11] 4,151,324

[45] Apr. 24, 1979

[54] PIEZOELECTRIC CRYSTALLINE FILMS AND METHOD OF PREPARING THE SAME

[75] Inventors: Toshio Ogawa, Nagaokakyo; Hiroshi Nishiyama, Mukou; Tasuku Mashio, Nagaokakyo, all of Japan

[73] Assignee: Murata Manufacturing Co., Ltd., Nagaokakyo, Japan

[21] Appl. No.: 886,821

[22] Filed: Mar. 15, 1978

[30] Foreign Application Priority Data

Mar. 16, 1977 [JP] Japan .................................. 52-29497
Sep. 9, 1977 [JP] Japan ................................ 52-109256
Sep. 9, 1977 [JP] Japan ................................ 52-109257
Sep. 9, 1977 [JP] Japan ................................ 52-109258

[51] Int. Cl.$^2$ ........................ C23C 13/00; C04B 35/00
[52] U.S. Cl. ............................. 428/432; 204/192 SP; 252/62.9; 427/100; 428/469; 428/539
[58] Field of Search ................. 204/192 SP; 252/62.9; 427/100; 428/432, 469, 539

[56] References Cited

U.S. PATENT DOCUMENTS 3,766,041  10/1973  Wasa et al. .......................... 252/62.9
3,988,232  10/1976  Wasa et al. ...................... 204/192 SP

OTHER PUBLICATIONS

Matsuoka et al., "Chem. Abstracts", vol. 83, 1975, 211890s.
Takayasuo et al., "Chem. Abstracts", vol. 85, 1978, 137565u.
Kaufmann et al., "Chem. Abstracts", vol. 78, 1973, 90534q.
Sasaki et al., "Chem. Abstracts", vol. 77, 1972, 156911y.
Dybwad, "Chem. Abstracts", vol. 76, 1972, 51535e.
Carlson, "Chem. Abstracts", vol. 61, 3845g.

*Primary Examiner*—Jack Cooper
*Attorney, Agent, or Firm*—Birch, Stewart, Kolasch & Birch

[57] ABSTRACT

Piezoelectric crystalline films on substrate, which consist essentially of a crystalline zinc oxide film with a c-axis perpendicular to a substrate surface, containing 0.01 to 20.0 atomic percent of at least one element selected from the group consisting of iron, chromium, cobalt and nickel.

8 Claims, 1 Drawing Figure

PIEZOELECTRIC CRYSTALLINE FILMS AND METHOD OF PREPARING THE SAME

The present invention relates to piezoelectric crystalline films. More particularly, it relates to piezoelectric crystalline films comprising zinc oxide having a hexagonal crystal structure.

There are many methods for making piezoelectric zinc oxide films such as, for example, vacuum deposition methods, epitaxial growth methods, and sputtering methods. Among these methods, the sputtering methods, particularly, a radio-frequency sputtering method has been used very often recently because it has the advantage that a high growing rate of the oriented crystalline films is possible, thus making it possible to mass-produce piezoelectric crystalline films industrially.

When making a piezoelectric crystalline film of zinc oxide on a substrate surface with the radio-frequency sputtering method, ceramics of highly pure zinc oxide have been conventionally used as a source of the film material. However, even when the radio-frequency sputtering is effected with such a film material source, it results in the formation of a crystalline film which is poor in its adhesion to a substrate and low in quality. In addition, it is difficult with such a film material source to make a piezoelectric crystalline film with a c-axis perpendicular to the substrate surface. If a piezoelectric crystalline film of zinc oxide possesses poor adhesion, various disadvantages occur. For example, when manufacturing an acoustic surface wave filter with such a zinc oxide film, it is difficult to form interdigital transducers on the film surface, and the acoustic surface wave filter thus produced tends to cause the disconnection of interdigital transducers, and possess a large propagation loss of acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

It has now been found that the use of ceramics of zinc oxide containing at least one element selected from the group consisting of iron, chromium, cobalt and nickel makes it possible to produce a piezoelectric crystalline film with a c-axis perpendicular to the substrate surface and high quality.

It is an object of the present invention to provide an improved zinc oxide piezoelectric crystalline film which overcomes the aforesaid disadvantages.

According to the present invention, there is provided a piezoelectric crystalline film of zinc oxide with a c-axis perpendicular to the substrate surface, characterized in that said crystalline film contains 0.01 to 20.0 atomic percent of at least one element selected from the group consisting of iron, chromium, cobalt and nickel.

The piezoelectric crystalline film of the present invention may be made by any conventional methods such as, for example, the radio-frequency sputtering methods, the cosputtering methods and the ion plating methods.

The present invention will be further apparent from the following description with respect to examples and the accompanying drawing, in which:

The FIGURE is a diagrammatic view of the radio-frequency sputtering apparatus used for making piezoelectric crystalline films according to the present invention.

Referring now to the FIGURE, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a film material source 4 consisting essentially of ceramics of zinc oxide containing at least one element selected from the group consisting of iron, chromium, cobalt and nickel. A shutter 5 is positioned between electrodes 2 and 3. A substrate 6 of glass or metal is fixed to the bottom of the anode 3. The substrate 6 is heated to a temperature of 200° to 500° C. during sputtering. A vent 7 and a gas inlet 8 are provided to the bell jar 1.

The radio-frequency sputtering is effected in the following manner: After making airtight, the bell jar 1 is evacuated through the ventage 7 to a pressure not higher than $1 \times 10^{-6}$ Torrs, and then supplied with argon or oxygen gas or a mixed gas of argon and oxygen through the gas inlet 8 whereby adjusting the pressure to $1 \times 10^{-1}$ to $1 \times 10^{-3}$ Torrs. A radio-frequency voltage is applied between the cathode 2 and the bell jar 1 by the radio-frequency electric power source 9. Electric power of 2 to 8 W/cm² is supplied to the film material source 4.

The film material source consisting essentially of ceramics of zinc oxide containing at least one element selected from the group consisting of iron, chromium, cobalt and nickel is prepared in the following manner:

Using powder of ZnO, $Fe_2O_3$, $Cr_2O_3$, CoO and NiO as raw materials, there are prepared mixtures each having a compositional proportion shown in Table 1. Each of the mixtures is milled by the wet process, dried and then presintered at 600° to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm² and then fired at 1200° C. for 2 hours to obtain film material sources.

The thus obtained film material sources were subjected to measurements of percentage of bulk density $d_s$ to theoretical density $d_t$ ($d_s/d_t \times 100$). The results as obtained are shown in Table 1.

Table 1

| | | Material | | Zinc oxide film | | |
|---|---|---|---|---|---|---|
| Ex. No. | Additive (atom %) | Resistivity (.cm) | source $d_s/d_t \times 100$ (%) | Orientation $\bar{x}(°)$ | $\sigma(°)$ | Adhesion |
| 1 | — | 8.6×10 | 85 | 5.8 | 5.5 | bad |
| 2 | Fe: 0.05 | 1.2×10³ | 90 | 0.8 | 2.4 | good |
| 3 | Fe: 0.1 | 1.7×10² | 92 | 0.3 | 1.6 | " |
| 4 | Fe: 5.0 | 4.1×10 | 91 | 2.0 | 3.8 | " |
| 5 | Cr: 0.05 | 3.3×10 | 87 | 0.9 | 1.9 | " |
| 6 | Cr: 0.1 | 9.7×10 | 91 | 1.2 | 2.2 | " |
| 7 | Cr: 5.0 | 4.0×10 | 90 | 2.7 | 3.1 | " |
| 8 | Co: 0.05 | 1.2×10 | 88 | 1.5 | 2.1 | " |
| 9 | Co: 0.1 | 2.1×10 | 90 | 0.9 | 2.5 | " |
| 10 | Co: 5.0 | 3.0×10 | 89 | 3.9 | 4.2 | " |
| 11 | Ni: 0.05 | 1.9×10 | 89 | 1.3 | 2.7 | " |
| 12 | Ni: 0.1 | 7.6×10 | 91 | 1.9 | 3.3 | " |
| 13 | Ni: 5.0 | 2.3×10 | 90 | 3.4 | 3.6 | " |

Using the respective film material sources obtained, zinc oxide piezoelectric crystalline films are made on glass substrates with the aforesaid radio-frequency sputtering apparatus. The radio-frequency sputtering is carried out under the following conditions: A mixed gas of 90 vol% of argon and 10 vol% of oxygen is supplied to the bell jar 1 through the gas inlet 8, thereby adjusting the pressure in the bell jar 1 to $2\times10^{-3}$ Torrs. The glass substrate is heated to and kept at 350° C. The film material source 4 is supplied 6 W/cm² of electric power with a frequency of 13.56 MHz.

The c-axis orientation of the thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation (Japan). vol. 2 (1973) page 84; and Makoto Minakata, The Tohoku University Doctor's Thesis (1974)). The mean value (X) and standard deviation (δ) of the angle of the c-axis with respect to the axis perpendicular to the substrate surface were obtained from respective specimens. The results of the measurement of the adhesion of the film to the substrate are also shown in Table 1. The experiment to determine whether or not the film has sufficient adhesive force was carried out by the thermal shock test method 107C of MIL-STD-202D. A film peeled off from the surface of the substrate was judged as "bad" and, a film which shows no change was judged as "good".

As is evident from Table 1, the crystalline films of the present invention have a c-axis approximately perpendicular to the substrate surface. This means that it is possible to produce excellent piezoelectric crystalline films with a large electromechanical coupling factor. Also, it will be seen that the crystalline films embodying the present invention possess good adhesion.

In the above examples, iron, chromium, cobalt and nickel are used in the oxide form, but any other form such as metal, compounds or alloys thereof may be used as a raw material for preparing film material source. In such cases, the same results can be obtained if such additive elements are contained in the resultant zinc oxide piezoelectric crystalline film. The concentration of the additive elements in the sputtered zinc oxide films according to the present invention ranges from 0.01 to 20.0 atomic percent. If the concentration of the additive element is less than 0.01 atomic percent, the adhesion of the resultant crystalline films to the substrates changes for the worse, and if the concentration of the additive element is more than 20.0 atomic percent, the direction of the crystallographic orientation of the zinc oxide films can not be well controlled, resulting in a disadvantageous change in the orientation of the zinc oxide films.

The use of the film material source containing at least one element selected from the group consisting of iron, chromium, cobalt and nickel possesses the following advantages.

When mass-producing piezoelectric crystalline films industrially by the radio-frequency sputtering methods, it is necessary to increase the growing rate of the crystalline film. In such case, the electric power supplied to the film material source per unit area thereof must be increased so that it is required to have a high bulk density. This requirement is fully satisfied by the film material source containing at least one element of the group consisting of iron, chromium, cobalt and nickel. As is evident from Table 1, the film material source used in the present invention has a bulk density higher than the conventionally used ones so that the film material source containing said additive element makes it possible to mass-produce zinc oxide piezoelectric crystalline films by the use of high electric powers.

What is claimed is:

1. A piezoelectric crystalline film disposed on a substrate, said film consisting essentially of a crystalline zinc oxide film with a hexagonal crystalline structure and a c-axis substantially perpendicular to the substrate surface, characterized in that said crystalline zinc oxide film contains 0.01 to 20.0 atomic percent of at least one element selected from the group consisting of iron, chromium, cobalt and nickel.

2. The piezoelectric crystalline film according to claim 1 wherein said element is iron.

3. The piezoelectric crystalline film according to claim 1 wherein said element is chromium.

4. The piezoelectric crystalline film according to claim 1 wherein said element is cobalt.

5. The piezoelectric crystalline film according to claim 1 wherein said element is nickel.

6. The piezoelectric crystalline film according to claim 1, wherein the substrate is metal.

7. The piezoelectric crystalline film according to claim 1, wherein the substrate is glass.

8. A method for making piezoelectric crystalline films comprising simultaneously sputtering zinc oxide and at least one element selected from the group consisting of iron, chromium, cobalt and nickel from a film material source onto a metal or glass substrate to form a crystalline zinc oxide film with a hexagonal crystal structure and a c-axis substantially perpendicular to the substrate surface, said zinc oxide containing 0.01 to 20.0 atomic percent of at least one of said elements, wherein said sputtering is effected by radio-frequency sputtering in an atomosphere of argon or oxygen, or a mixture of argon and oxygen under a pressure of $1 \times 10^{-1}$ to $1 \times 10^{-3}$ Torr, and wherein said film material source consists essentially of a ceramic of zinc oxide containing at least one of said elements, said substrate being positioned on an anode placed in parallel with a cathode on which said film material source is positioned, said film material source being supplied with an electric power of 2 to 8 w/cm² and said substrate being maintained at a temperature of 200° to 500° C. during sputtering.

* * * * *